(12) United States Patent
Hotchkiss et al.

(10) Patent No.: US 6,204,094 B1
(45) Date of Patent: Mar. 20, 2001

(54) METHOD AND APPARATUS FOR POPULATING AN ADHESIVE SHEET WITH PARTICLES

(75) Inventors: Gregory B. Hotchkiss, Richardson; Robert J. Lessard, Garland, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/241,714

(22) Filed: Feb. 2, 1999

Related U.S. Application Data
(60) Provisional application No. 60/073,614, filed on Feb. 4, 1998.

(51) Int. Cl.[7] ............................ H01L 21/44; H01L 21/48; H01L 21/50; B23K 35/12
(52) U.S. Cl. ......................... 438/120; 438/108; 228/245
(58) Field of Search ................................ 438/108, 118, 438/120; 228/175, 212, 245, 246

(56) References Cited

U.S. PATENT DOCUMENTS
5,431,332 * 7/1995 Kirby ............................... 228/246

* cited by examiner

Primary Examiner—Charles Bowers
Assistant Examiner—Nema Berezny
(74) Attorney, Agent, or Firm—Gary C. Honeycutt; Fred Telecky; Arthur I. Navarro

(57) ABSTRACT

A method for assembling electronic devices by moving particles (12) on an adhesive sheet (35) having a plurality of adhesive areas (30), comprising the steps of loading the particles (12) onto the adhesive sheet (35) and transferring kinetic energy from a mechanical device (39) to the particles (12) for moving the particles (12) is disclosed. The adhesive sheet (35) may be composed of an adhesive coating (22) laminated to a film (24). The particles (12) may be composed of a variety of materials, including minerals and compounds such as solder or polymers.

19 Claims, 5 Drawing Sheets

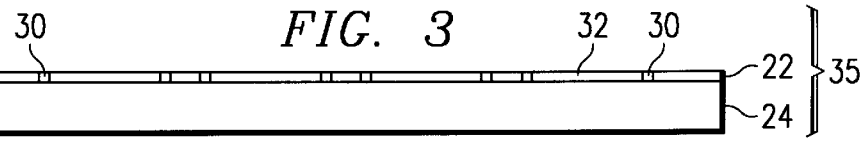
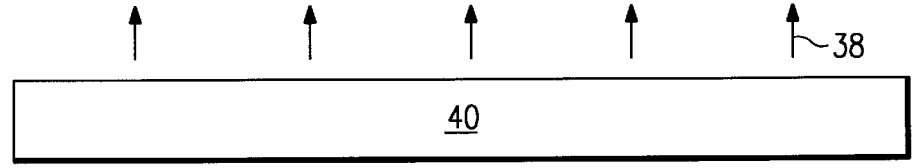
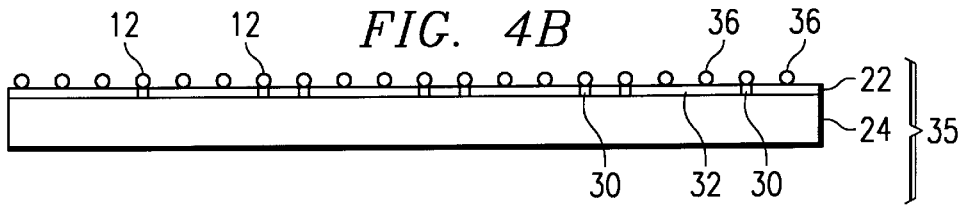
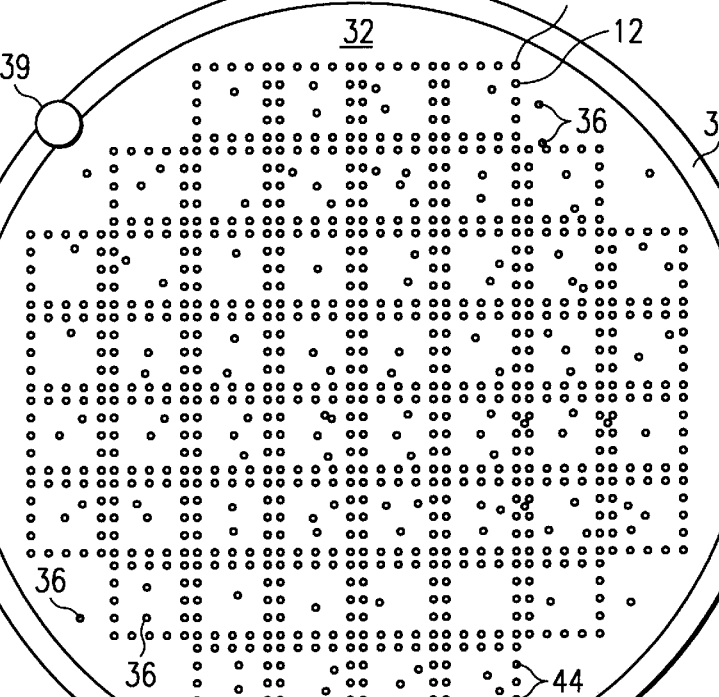

METHOD AND APPARATUS FOR POPULATING AN ADHESIVE SHEET WITH PARTICLES

This appln claims the benefit of U.S. Provisional Ser. No. 60/073,614, filed Feb. 4, 1998.

TECHNICAL FIELD OF THE INVENTION

The present invention relates in general to the field of electronic device packaging and more particularly to a method and apparatus for attaching electrically conductive particles to a substrate.

BACKGROUND OF THE INVENTION

Without limiting the scope of the invention, its background is described in connection with electronic device packaging, as an example.

Modern electronic components utilize numerous integrated circuits. These integrated circuits must often be electrically connected to each other or to other electronic components. One method for connecting integrated circuits to electronic components utilizes an area array electronic package, such as a ball-grid array (BGA) package or a flip-chip package. The electrical connections between an integrated circuit packaged in an area array package design and a printed circuit board (PCB) are typically composed of solder.

With ball grid array packages, various input and output ports of an integrated circuit are typically connected via wire bonds to contact pads of the ball grid array electronic package. Solder balls formed on the contact pads of the ball grid array electronic package are used to complete the connection to another electronic component, such as a printed circuit board (PCB).

Integrated circuits are also connected to electronic components through a flip-chip electronic package design. The flip-chip electronic package is similar to the ball grid array electronic package in that solder balls are used to make a connection with other electronic components, such as a PCB. Solder balls are also used in a flip-chip design to attach the input and output ports of the substrate to the contact pads of the integrated circuit. As such, flip-chip packages do not require wire bonds. These solder balls or bumps may be formed on the face of integrated circuits as they reside on semiconductor wafers before being sawed into individual dies.

Therefore, an important step in the interconnection of many electronic components is the formation and attachment of solder balls.

Heretofore, in this field, solder bumps or balls have been typically formed utilizing one of four methods: (1) printing of solder paste through a stencil or mask; (2) electroplating; (3) evaporation; or (4) mechanical transfer of preformed solder spheres. While electroplating, printing of solder paste through a stencil or mask, and evaporation techniques have been typically utilized for forming solder bumps on wafers and integrated circuits, BGA and chip-scale packages (CSP) have commonly utilized printing of solder paste and mechanical transfer of solder ball techniques.

Transfer of solder balls has been customarily achieved by means of vacuum chucks or machined templates. Another method for transferring preformed solder balls utilizes formation of a pattern of dots onto a photoimageable coating laminated to an organic film. Typically the organic film is composed of a material having a high melting temperature that is capable of being exposed to temperatures exceeding 200 C with very little degradation, such as polyimide.

The pattern is formed by placing a photomask on the coating and then exposing the coating to a dose of ultraviolet radiation. For example, for an area array package design, the photomask contains a mirror image of the contact pads design. The areas protected by the photomask design retain their adhesiveness while the unprotected areas exposed to the ultraviolet radiation lose their adhesiveness. The array of adhesive areas corresponds to the pattern of contact pads found on the substrate, wafer or die to receive the solder connections.

After the adhesive areas are formed, solder balls are loaded onto the surface of the film and attach to the adhesive areas. The excess solder balls that lie on non-adhesive areas are removed. The populated film is then aligned and brought into contact with contact pads, which may be fluxed. A solder reflow is performed to transfer the solder balls from the adhesive areas to the contact pads of the substrate. Following the reflow cycle, the film is removed from the solder balls.

SUMMARY OF THE INVENTION

In order to produce a functional electronic device, it is preferable that the loading of the solder balls onto an organic film having discrete adhesive areas thereon results in 100% population of the adhesive areas. It has been discovered, however, that loading of solder balls is adversely affected by.many factors. For example, generation of electrostatic charges through the effects of tribocharging has often resulted in increased numbers of excess solder balls residing on the surface and clinging together in groups. Tribocharging is the ionic charging of particles resulting from moving them in the air. Without extensive ionizing equipment, it has been difficult to remove the excess solder balls or to break up the pairs and triplets. Tribocharging is also affected by the relative humidity of the surrounding air.

Moreover, the surface texture and contamination of solder balls have had an adverse effect on the attachment of solder balls to the adhesive areas. For example, solder balls with surface oxides have been more apt to collect electrostatic charges than oxide-free solder balls.

Furthermore, the adhesiveness of the adhesive areas has affected the ability of the adhesive areas to capture and retain solder balls. Areas with insufficient adhesiveness have often failed to capture or retain solder balls, even following repeated attempts. Such a failure to attach a solder ball to each adhesive area may result in the failure of the electronic device.

In addition to the difficulties associated with loading the solder balls, it has also been discovered that problems exist with respect to the removing of excess solder balls. Removal of the extra solder balls that are not intended to be attached to the adhesive areas has generally been accomplished by two methods. In one method, a gas stream is passed over the film to remove any excess solder balls. In particular, the gas stream may be at a slight angle to the surface of the film. The forces created by the stream, however, may not exceed the adhesiveness of the adhesive areas. Oftentimes increasing the adhesiveness of the adhesive areas also increases the adhesiveness of the background which confounds the removal process. The removal is more effective if the gas stream is integrated with a ionizer such as an AC corona discharge to prevent tribocharging of the organic film and solder balls.

In another method, mechanical means for removing solder balls has been utilized, albeit less successfully than gas removal, prior to the present invention. Strictly mechanical removal has also been thought to be more difficult to automate. For example, vibrating tables, manual gyrations or shaking, and pulsating the solder balls have been attempted and have sometimes been used in conjunction with a gas stream.

Although the gas stream may remove extra solder balls, it is not an effective way of increasing the chances that an adhesive area will contact and capture a solder ball during loading. The gas stream only moves the spheres sideways, whereas the preferred motion is a force acting normal to the surface of the adhesive film. It is preferable if the spheres bounce on top of the adhesive film. This type of motion may be effectively accomplished mechanically.

Therefore, a need has arisen for an automated method of attaching solder balls to, and removing excess solder balls from, an adhesive film. A need has also arisen for an apparatus for attaching solder balls to a substrate.

The present invention disclosed herein may comprise a method for attaching solder particles to, and removing excess solder particles from an adhesive sheet, comprising the steps of obtaining an adhesive sheet having a plurality of adhesive areas, loading the solder particles to the adhesive sheet, transferring kinetic energy to the solder particles for distributing the solder particles on the adhesive sheet, transferring kinetic energy to the solder particles for removing the solder particles not adhered to the plurality of adhesive areas, aligning the solder particles attached to the plurality of adhesive areas with contact pads of the substrate, securely attaching the solder particles to the contact pads, and removing the adhesive sheet from the solder particles.

The present invention may also comprise an apparatus for attaching particles to a substrate, comprising an adhesive sheet, a plurality of particles connected the adhesive sheet, and a.mechanical device transferring kinetic energy to move the particles.

BRIEF DESCRIPTION OF THE DRAWINGS

For a more complete understanding of the features and advantages of the present invention, reference is now made to the detailed description of the invention along with the accompanying figures in which:

FIG. 3 is a cross-sectional view along line 3—3 of the wafer-scale adhesive sheet of FIG. 2;

FIG. 4A is a cross-sectional view of a thermal energy source below an adhesive sheet in accordance with the present invention;

FIG. 4B is a cross-sectional view of an adhesive sheet with solder particles attached thereto in accordance with the present invention;

FIG. 4C is a plan view of a wafer-scale adhesive sheet loaded with solder particles;

DETAILED DESCRIPTION OF THE INVENTION

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention and do not delimit the scope of the invention.

Figure 1:
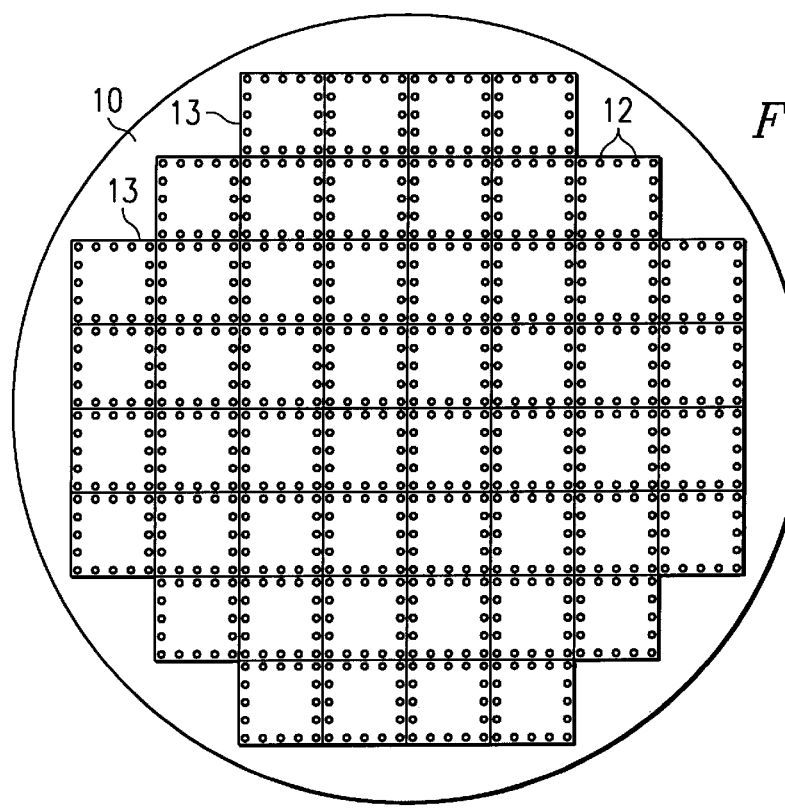
FIG. 1 is a plan view of a semiconductor wafer with solder particles attached thereto in accordance with the present invention.

Reference is now made to FIG. 1, which depicts a semiconductor wafer 10 with solder particles 12 attached thereto in accordance with the present invention. Solder particles 12 are typically attached to contact pads (not explicitly shown in FIG. 1) of semiconductor wafer 10. Semiconductor wafer 10 may be composed of silicon, gallium arsenide, or any other semiconductor material used in electronic device manufacturing. Semiconductor wafer 10 may be divided into a plurality of dies 13 for use in electronic components.

Solder particles 12 are generally discrete, free-flowing particles that may have a variety of compositions. For example, solder particles 12 may be composed of solder alloys including combinations of tin, lead, silver, bismuth, copper, indium, antimony, and cadmium; however, other suitable conductive materials may be used including synthetic compounds such as plastic.

Solder particles 12 are typically solder spheres having a diameter in a range of approximately 3 mils to approximately 30 mils; however, it should be appreciated by persons skilled in the art that the principles of the present invention are applicable to solder particles 12 of other dimensions and configurations, such as rectangular or cylindrical columns.

Also, solder particles 12 may be attached directly to other substrates, such as an interposer or an integrated circuit in a flip-chip package. Electronic substrates or interposers consist of an insulating material having electrically conductive paths extending through the interposer from the surface to the opposite surface forming electrical entry and exit paths.

Figure 2:
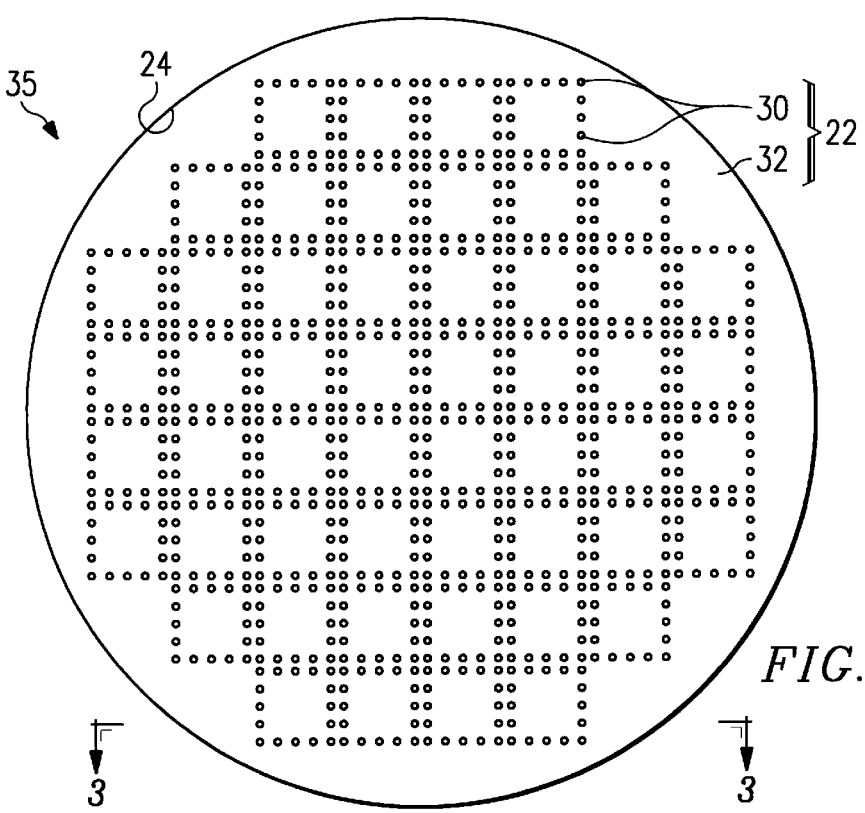
FIG. 2 is a plan view of a wafer-scale adhesive sheet for use in the present invention.

FIG. 2 depicts an adhesive sheet for use in the present invention generally designated as 35. In one embodiment of the invention, adhesive sheet 35 comprises a photoimageable adhesive coating 22 laminated onto a film 24 such as Kapton® or Mylar®, for example, as shown in the cross-sectional view of FIG. 3. Adhesive coating 22 is typically approximately 4 to approximately 6 microns thick, and film 24 is typically approximately 50 microns thick; however, it should be understood by one skilled in the art that the principles of the present invention are applicable to varying thicknesses. In forming adhesive sheet 35, photolithography may be utilized to create a plurality of discrete adhesive areas 30 and non-adhesive areas 32, such that the pattern of adhesive areas 30 corresponds to a pattern of contact pads. A more complete description of adhesive patterns formed utilizing photolithography is described in U.S. Pat. No. 5,356,751, issued to Cairncross, et. al., the contents of which are incorporated herein by reference.

The diameter of adhesive areas 30 is typically approximately half of the diameter of solder particles 12; however, it should be appreciated by one skilled in the art that the principles of the present invention are applicable to adhesive areas 30 of other dimensions. Furthermore, while adhesive areas 30 are depicted in FIG. 2 as circular areas suitable for receiving spherical solder particles 12, it should be appreciated by persons skilled in the art that adhesive areas 30 may have a variety of other configurations, including oval, square, and rectangular. The pattern of adhesive areas 30 corresponds to the pattern of contact pads 42 of substrate 14 to which solder particles 12 will be attached.

As shown in FIG. 4A, thermal energy 38 emitted from thermal energy source 40 may be applied to adhesive sheet 35. Thermal energy source 40 may consist of a variety of mechanisms, such as optical heating (e.g., tungsten halogen lamps), a hot plate, a radiator, infrared heaters, or other similar devices. Thermal energy 38 may be conductively transferred to adhesive sheet 35 via direct contact of thermal energy source 40 with adhesive sheet 35. Alternatively, thermal energy 38 may be radiantly or convectively transferred to adhesive sheet 35.

Significant improvement is obtained by application of thermal energy 38 in accordance with the present invention. For example, it increases the adhesiveness of adhesive areas 30, thereby improving the likelihood of each of the adhesive areas 30 capturing and retaining one of the solder particles 12. Such a configuration of attachment of one of the solder particles 12 to each of the adhesive areas 30 is generally termed 100% yield, or full population.

Thermal energy 38 may be maintained for a period of time, for example, one to sixty seconds. The temperature produced by thermal energy 38 will be dependent upon the particular composition of adhesive sheet 35. As such, temperatures from approximately above room temperature to below the melting point of solder particles 12 are within the scope of the invention.

Moreover, achieving enhanced yield by application of thermal energy 38 also reduces the need for repeated loading cycles in an effort to fully populate surface number of adhesive sheet 35. A reduction in cycle time, in turn, reduces operational costs.

Furthermore, application of thermal energy 38 to adhesive layer 35 reduces the negative effects of contamination and tribocharging. Generation of electrostatic charges. through the effects of tribocharging often results in increased numbers of excess solder particles 36 and solder particles 12 clinging together in pairs or triplets, for example. Also, the surface texture and contamination of solder particles 12 has an adverse effect on attachment of solder particles 12 to adhesive areas 30. For example, solder particles 12 with surface oxides are more likely to collect electrostatic charges than oxide-free solder particles.

During or directly following the step of applying thermal energy 38 is the step of loading, or transferring, solder particles 12 onto adhesive sheet 35, as depicted in FIG. 4B. A plurality of solder particles 12, including excess solder particles 36, is loaded onto adhesive sheet 35. Solder particles 12 are captured and retained by adhesive areas 30.

Oftentimes, initial loading of solder particles 12 to adhesive sheet 35 does not result in full population. As shown in FIGS. 4B and 4C, excess solder particles 36 may lie on non-adhesive areas 32 of adhesive sheet 35, while some uncovered adhesive areas 44 have not received a solder particle 12. To ensure that a solder particle 12 adheres to each adhesive area 30, a feature of the present invention is to apply kinetic energy by means of a mechanical device 39 to forcibly distribute solder particles 12 over the entire surface of adhesive sheet 35.

As shown in FIG. 4C, adhesive sheet 35 may be securely mounted onto a support 37 by means of tape, for example. Support 37 may be circular, for example, for supporting a wafer-scale adhesive sheet 35. Support 37 is typically composed of metal but may be composed of non-metal materials, including plastics or glass.

In one embodiment of the present invention, the vertical motion of mechanical device 39 may be placed against the top of support 37 to transfer kinetic energy to solder particles 12. In another embodiment of the present invention, mechanical device 39 may be placed on the side or below support 37 and normal to the surface of adhesive sheet 35. Alternatively, mechanical device 39 may be applied directly against the surface of adhesive sheet 35.

Figure 4D:
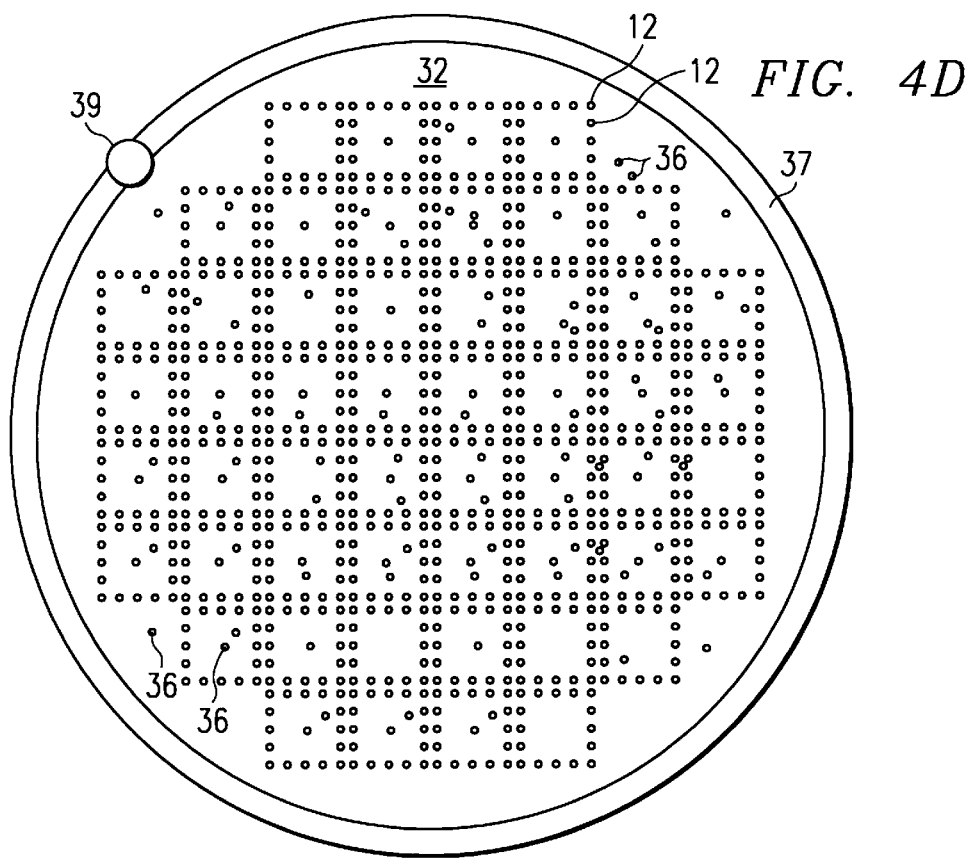
FIG. 4D is a plan view of a wafer-scale adhesive sheet loaded with solder particles after vibration by a mechanical device.

The agitated state of solder particles 12 induced by mechanical device 39 significantly reduces the number of uncovered adhesive areas 44 without a solder particle 12. As shown in FIG. 4D, following application of mechanical device 39, each of adhesive areas 30 is covered by a solder particle 12.

Mechanical device 39 may be an automated device such as an engraving pencil or other vibrating instrument that operates at a suitable frequency. The frequency of the vibrations depends on several factors, including the area of adhesive sheet 35, the size of solder particles 12, the number of adhesive areas 30, and the complexity of the arrangement of contact pads 42 on semiconductor wafer 10. For example, for a wafer-scale adhesive sheet 35 for use with a semiconductor wafer 10 having a diameter of approximately 100 mm, mechanical device 39 may have a frequency of approximately 7200 strokes per minute. It should be apparent to one skilled in the art, however, that other frequencies, such as frequencies in the range of approximately 1,000 strokes per minute to approximately 100,000 strokes per minute, are within the scope of the invention. Furthermore, other mechanical devices that are well known in the art may be utilized for transferring kinetic energy to solder particles 12.

Adhesive sheet 35, with solder particles 12 attached thereto and excess solder particles 36 residing thereon, may then be positioned such that the surface of adhesive sheet 35 having excess solder particles 36 residing thereon faces downward, and gravity pulls excess solder particles 36 away from non-adhesive areas 32 of adhesive sheet 35. Gravitational forces, however, may not successfully remove all excess solder particles 36, which often cling to each other and to adhesive sheet 35 due to electrostatic forces. Therefore, mechanical device 39 may again be placed against support 37 normal to adhesive sheet 35 to transfer kinetic energy to solder particles 36, thereby removing any remaining excess solder particles 36. The loading of solder particles 12 and the removal of excess solder particles 36 is made more effective if ionizing equipment such as an AC corona discharge is used. Placing adhesive sheet 35 with particles 12 residing thereon under the influence of ionizing equipment is effective for preventing tribocharging of adhesive sheet 35 and solder particles 12. Suitable ionizing equipment is well known in the art, and may take a variety of configurations. For example, the ionizing equipment may be suspended above adhesive sheet 35, or may be an enclosure containing adhesive sheet 35.

Significant improvement is obtained by utilizing mechanical device 39 in accordance with the present invention. Mechanical device 39 both enhances loading of solder particles 12 and effectively removes excess solder particles 36. Combining these two functions in one automated mechanical device 39 reduces cycle time and eliminates equipment, which may significantly reduce operating costs.

Figure 4E:
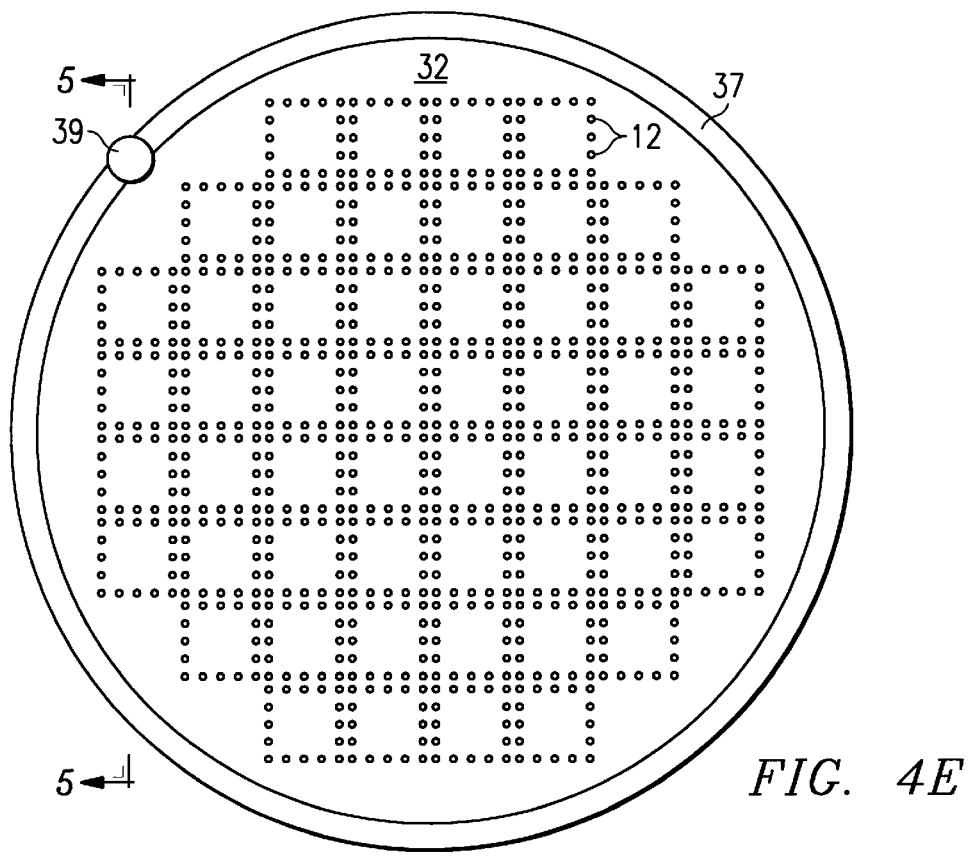
FIG. 4E is a plan view of a wafer-scale adhesive sheet fully populated with solder particles.
Figure 5:
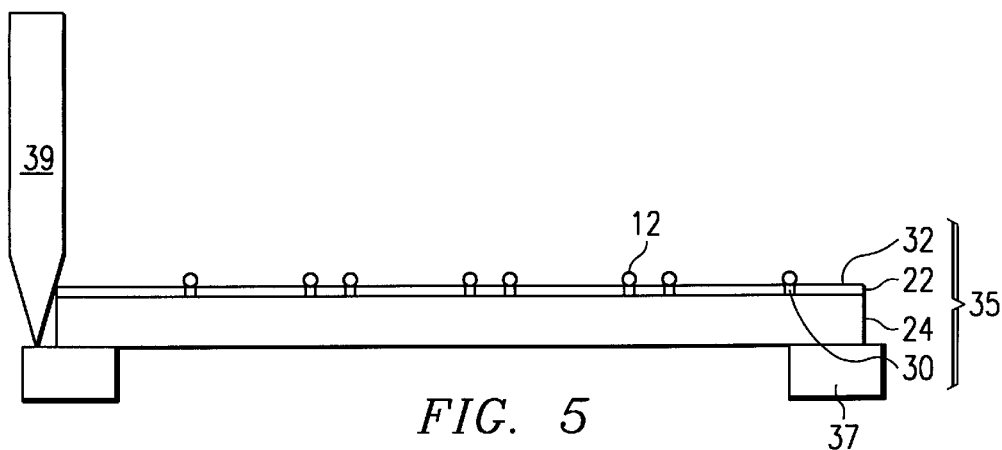
FIG. 5 is a cross-sectional view of the wafer-scale adhesive sheet taken along line 5—5 of FIG. 4E.

As a result of utilizing mechanical device 39 for both enhancing loading of solder particles 12 and removing excess solder particles 36, only solder particles 12 adhered to adhesive areas 30 remain on adhesive sheet 35, with no excess solder particles 36, as depicted in FIGS. 4E and 5. Furthermore, each of the adhesive areas 30 is covered by one solder particle 12 and none of solder particles 12 are clinging together.

Figure 6:
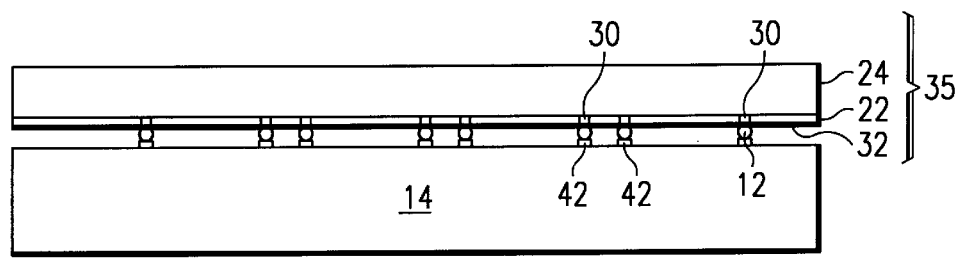
FIG. 6 is a cross-sectional view of solder particles aligned with contact pads of a substrate in accordance with the present invention.

Turning now to FIG. 6, the alignment of contact pads 42 of substrate 14 with solder particles 12, which are attached to adhesive areas 30 of adhesive sheet 35, is depicted. Alignment may be achieved utilizing mechanical or optical systems, or both, as should be known by one skilled in the art.

Prior to reflow, adhesive sheet 35 may be exposed to radiation or heat while solder particles 12, attached to adhesive areas 30 of adhesive sheets 35, are in close aligned proximity to contact pads 42. Exposure to heat or ultraviolet radiation, for example, significantly degrades the adhesiveness of adhesive areas 30, thereby facilitating the removal of adhesive sheet 35 from solder particles 12. Such exposure allows removal of adhesive sheet 35 with less disturbance and interference to the shape and integrity of solder particles 12. In addition, such exposure decreases the adhesive residue left on solder particles 12.

Solder particles 12 used in the present invention may be securely attached to contact pads 42 using a variety of solder reflow systems, such as an optical heating reflow system, a vapor phase solder reflow system, or other solder reflow systems. In an optical heating reflow system, radiant heat from near infrared optical sources such as tungsten-halogen lamps may be utilized for rapid thermal ramping with minimal thermal inertia, thereby shortening cycle time.

The amount of heat supplied by the lamps is directly proportional to the supplied voltage. For example, higher voltage settings result in higher temperatures. Voltage input to the optical sources may be programmed to precisely match a prescribed temperature versus time profile. The heat from the infrared optical sources may uniformly heat substrate 14 with temperatures sufficient to melt solder particles 12 to form a metallurgical bond with contact pads 42.

With a vapor phase solder reflow system, vapor condenses to surround substrate 14 with a cloud of steam. A liquid, such as a nonchlorinated (non CFC) fluorocarbon is first heated with enough energy to form a vapor and to sustain a vapor cloud. When substrate 14 is then passed through the vapor, the vaporized liquid condenses thereon and gives off the latent heat of vaporization. This energy is then transferred to substrate 14. As long as substrate 14 remains in the vapor, the vapor continues to give off energy at a repeatable fixed rate and temperature, until substrate 14 reaches the temperature of the vapor.

Most commercially available fluorocarbons used for vapor phase reflow are formulated to vaporize at precisely stable reflow temperatures for different solder materials, as will be known to those skilled in the art.

The vaporization temperature will depend on the solder type being used. A brief list of the preferred temperatures of non-chlorinated fluorocarbons that are used as vapor fluids is shown below in conjunction with the composition of the solder type to be used. In one embodiment the composition of each of solder particles 12 is about 60% Pb (lead) and 40% Sn (tin), as this composition provides a strong adhesion between integrated circuit packages or between an integrated circuit package and a board, such as a motherboard, daughterboard or module board. Using the 60% Pb/40% Sn composition also dispenses with the need to provide solder paste on a solder pad, again due to the strong adhesion of the 60% Pb/40% Sn composition. Alternately, a variety of other materials may be used as solder particles 12, such as those described in the following chart. Solder particles 12 of the following compositions may be used with other solder reflow techniques.

Vaporization Temperatures and Solder Types

| Liquidus Temperature | Solder Type |
| --- | --- |
| 56, 80, 97, 101, 102 C and 155 C | 100 In |
| | 37 Sn/38 Pb/25 In |
| 165 C | 70 Sn/18 Pn/12 In |
| | 70 In/30 Pb |
| 174 C | 60 In/40 Pb |
| 190 C | 90 In/10 Ag |
| | 50 In/50 Pb |
| | 63 Sn/37 Pb |
| | 70 Sn/30 Pb |
| | 60 Sn/40 Pb |
| 215 C and 230 C | 60 Sn/40 In |
| | 60 Sn/40 Pb |
| | 63 Sn/37 Pb |
| | 70 Sn/30 Pb |
| | 62 Sn/36 Pb/2 Ag |
| 240 C and 253 C | 75 Pb/25 In |
| | 81 Pb/19 In |
| 260 0 and 265 C | 96.5 Sn/3.5 Ag |

With an infrared or radiant heated solder reflow technique, each component of the soldering system is directly exposed to radiation from a heating element. Heat from the radiant energy element is absorbed by the different components according to its molecular structure.

Figure 7:
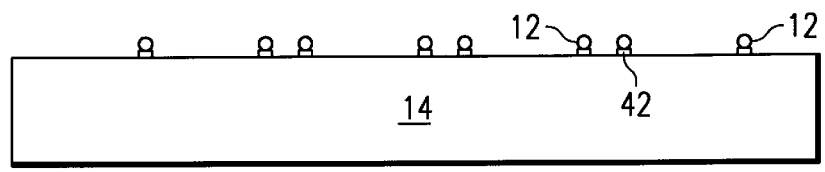
FIG. 7 is a cross-sectional view of a substrate with solder particles attached thereto in accordance with the present invention.

Removal of adhesive sheet 35 from solder particles 12 results in substrate 14 with solder particles 12 attached to contact pads 42, as depicted in FIG. 7. Substrate 14 may be used in a variety of integrated circuit packages, such as a ball grid array package or a flip-chip package, or with an integrated circuit interposer. Substrate 14 may also be a semiconductor wafer 10, as shown in FIG. 1, or a die 13 of semiconductor wafer 10.

Figure 8:
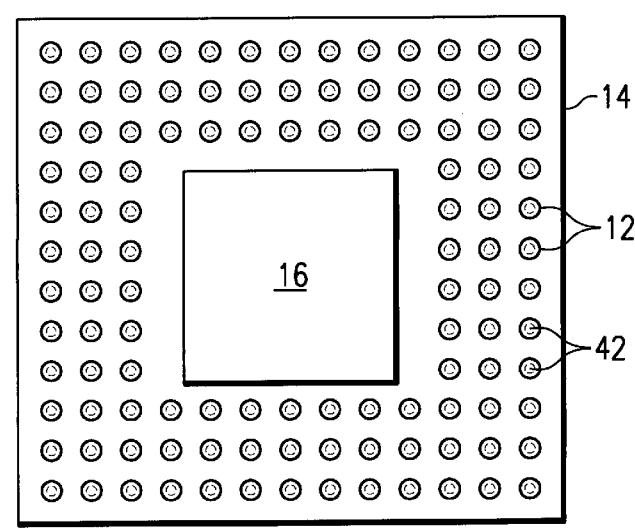
FIG. 8 is a plan view of a ball grid array package manufactured utilizing the principles of the present invention.

Reference is now made to FIG. 8, in which an exemplary ball grid array package is shown and generally designated as 11. In one embodiment, the present invention provides a method and apparatus for attaching a plurality of particles 12 to a substrate 14. Solder particles 12 are typically attached to contact pads 42 of substrate 14. Ball grid array package 11 is formed with an integrated circuit receiving area 16 for placement of an integrated circuit.

Ball grid array package 11 may be a conventional ball grid array package. Examples of conventional ball grid array substrate materials include organic laminates, ceramics, metals, and polymeric sheets and films. Ball grid array package 11 may also be any suitable substrate to which solder particles may be attached to facilitate electrical connection of electronic devices.

With ball grid array packages, various input and output ports of an integrated circuit are typically connected via wire bonds to contact pads 42 of ball grid array package 11. Solder balls 12 formed on contact pads 42 of the ball grid array electronic package 11 are used to complete the connection to another electronic component, such as a printed circuit board (PCB).

Figures 9, 10:
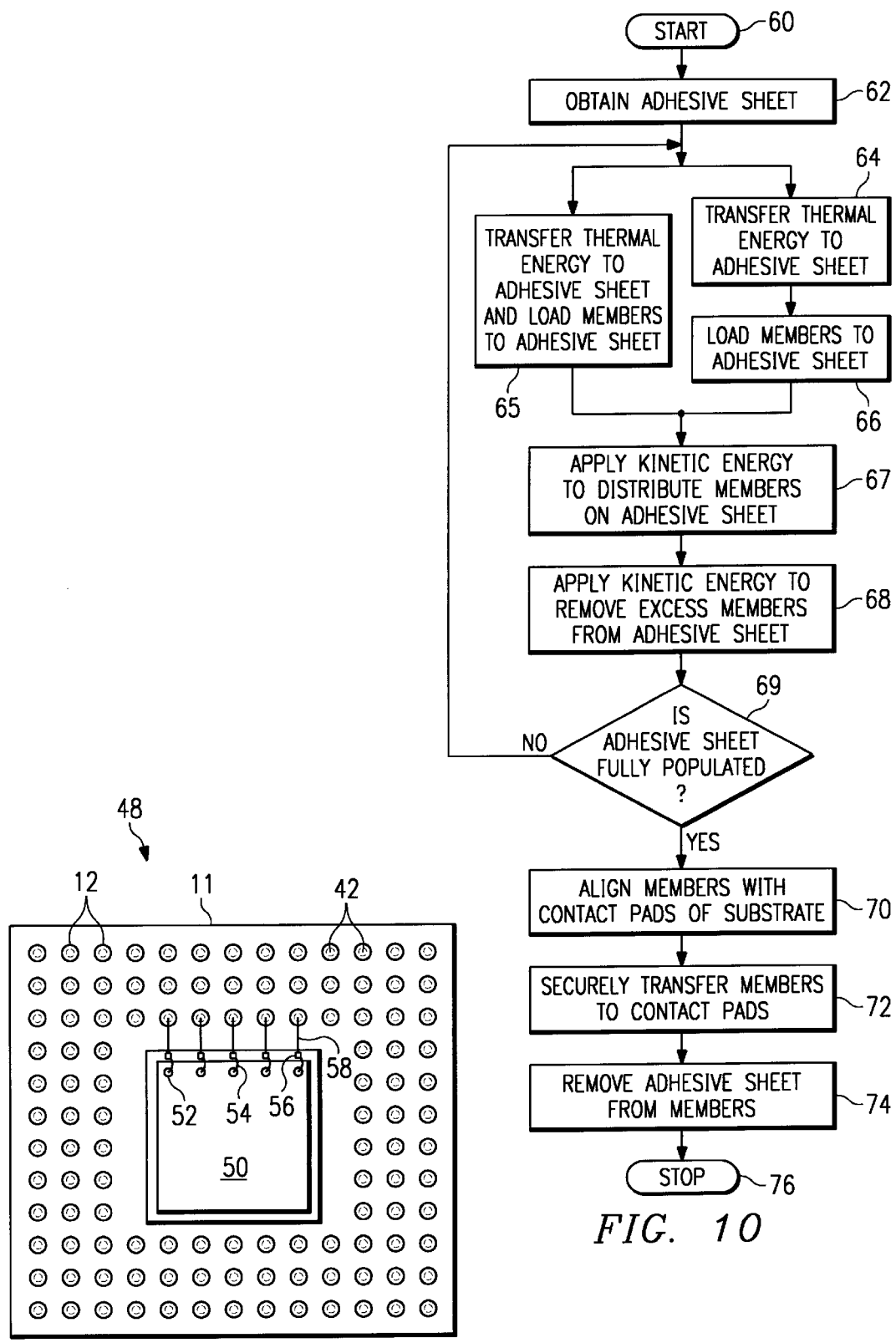
FIG. 9 is a plan view of an integrated circuit package manufactured utilizing the principles of the present invention.
FIG. 10 is a process flow diagram for a method for attaching solder particles to a substrate in accordance with the present invention.

Reference is now made to FIG. 9, which depicts a plan view of an exemplary integrated circuit package 48 utilizing an attachment-ready ball grid array package 11 in accordance with the invention. Integrated circuit package 48 comprises ball grid array package 11 with an integrated circuit 50 attached thereto. Bond pads 52 are electrically connected via wire bonds 54 to pads 56 on ball grid array package 11

Pads 56 are electrically connected to contact pads 42 via electrically conductive interconnect lines 58. Interconnect lines 58 may be patterned in one or more layers, with some of the interconnect lines 58 placed below the surface of ball grid array package 11. To protect the integrated circuit from the potentially corrosive nature of the atmosphere, the region surrounding integrated circuit 50, wire bonds 54, and bond pads 56 may be filled with polymeric material. Therefore, the formation of solder particles 12 on contact pads 42 facilitates electrical connection between integrated circuit 50 and another component, such as a printed circuit board.

FIG. 10 is a process flow chart for attaching solder particles 12 to substrate 14. The method step begins in step 60. According to the invention, in step 62, an adhesive sheet 35 is obtained having a surface with a plurality of adhesive areas 30 that correspond to the pattern of contact pads 42. In step 64, thermal energy 38 is transferred from thermal energy source 40 to adhesive sheet 35, as described with reference to FIG. 4A. Step 64 may occur before loading solder particles 12 to the surface of adhesive sheet 35 in step 66, as described with reference to FIGS. 4A–4C. Alternatively, steps 64 and 66 may occur simultaneously, as in step 65.

Next, in step 67, mechanical device 39 may be utilized to transfer kinetic energy to solder particles 12 in order to distribute solder particles 12 on adhesive sheet 35 such that each adhesive area 30 retains a solder particle 12, as described with reference to FIGS. 4C and 4D. In step 68, adhesive sheet 35 may then be rotated such that gravity forces remove excess solder particles 36 from adhesive sheet 35, and mechanical device 39 may again be utilized to transfer kinetic energy to remove excess solder particles 36, as described with reference to FIGS. 4E and 5.

If adhesive sheet 35 is fully populated in decision 69, then process flow may proceed to step 70; otherwise, process steps 64, 66, 67, and 68 may be repeated, or alternatively, steps 65, 67, and 68 may be repeated, until adhesive sheet 35 is fully populated with solder particles 12.

In step 70, solder particles 12 attached to fully populated adhesive sheet 35 may be aligned with substrate 14 such that each of the solder particles 12 comes in contact with a contact pad 42 of substrate 14 as described with reference to FIG. 6. In step 72, solder particles 12 may then be securely attached to contact pads 42 by reflow, for example, in a manner of choice as described with reference to FIG. 6. Finally, in step 74, adhesive sheet 35 is removed from solder particles 12, which are securely attached to contact pads 42 of substrate 14, as described with reference to FIG. 7. Process flow then ends in step 76.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for assembling electronic devices by populating electrically conductive particles on an adhesive sheet having a plurality of adhesive areas, comprising the steps of:
   loading the particles onto the adhesive sheet; and
   transferring kinetic energy from a mechanical device to the particles, said energy comprising a vertical force.

2. The method as recited in claim 1, wherein the step of transferring kinetic energy distributes the particles on the adhesive sheet to the adhesive areas.

3. The method as recited in claim 1, wherein the step of transferring kinetic energy removes excess particles not adhered to the adhesive areas.

4. The method as recited in claim 1, wherein said mechanical device moves at a frequency in the range of approximately 1,000 strokes per minute to approximately 100,000 strokes per minute.

5. The method as recited in claim 1, wherein the adhesive sheet is attached to a support.

6. The method as. recited in claim 5, wherein the mechanical device is in contact with said support.

7. The method as recited in claim 5, wherein said support comprises a metal ring.

8. The method as recited in claim 1, wherein the particles are composed of solder alloy.

9. The method as recited in claim 1, wherein the electronic device comprises an integrated circuit package.

10. A method for attaching solder particles to a substrate, comprising the steps of:
    obtaining an adhesive sheet having a plurality of adhesive areas;
    loading the solder particles to said adhesive sheet;
    transferring kinetic energy from a mechanical device to the solder particles for distributing the solder particles on said adhesive sheet;
    transferring kinetic energy to the solder particles for removing the solder particles not adhered to said plurality of adhesive areas;
    aligning the solder particles attached to said plurality of adhesive areas with contact pads of the substrate;
    securely attaching the solder particles to said contact pads; and
    removing said adhesive sheet from the solder particles.

11. The method as recited in claim 10 wherein the substrate is part of an integrated circuit package.

12. The method as recited in claim 10 wherein the substrate comprises a semiconductor wafer.

13. The method as recited in claim 10 wherein the step of securely attaching the solder particles further includes reflowing the solder particles.

14. The method as recited in claim 10, wherein the step of transferring kinetic energy further includes maintaining a frequency in the range of approximately 1,000 strokes per minute to approximately 100,000 strokes per minute.

15. A method for assembling electronic devices by populating electrically conductive particles on an adhesive sheet having a plurality of adhesive areas, comprising the steps of:
    loading the particles onto the adhesive sheet; and
    transferring kinetic energy from a vibrating pencil to the particles.

16. A method for assembling electronic devices by populating electrically conductive particles on an organic film having a plurality of adhesive areas, comprising the steps of:

loading the particles onto the film; and transferring kinetic energy from a mechanical device to the particles.

17. A method for assembling electronic devices by populating electrically conductive polymeric particles on an adhesive sheet having a plurality of adhesive areas, comprising the steps of:

loading the particles onto the adhesive sheet; and transferring kinetic energy from a mechanical device to the particles.

18. A method for assembling a semiconductor wafer by populating electrically conductive particles on an adhesive sheet having a plurality of adhesive areas, comprising the steps of:

loading the particles onto the adhesive sheet;

transferring kinetic energy from a mechanical device to the particles; and transferring selected particles from said sheet to said wafer.

19. A method for assembling electronic devices by populating electrically conductive particles on an adhesive sheet having a plurality of adhesive areas, comprising the steps of:

loading the particles onto the adhesive sheet;

transferring kinetic energy from a mechanical device to the particles; and placing the populated sheet in an ionizing environment for preventing tribocharging.

* * * * *